(12) United States Patent
Nemirovsky

(10) Patent No.: US 10,890,555 B2
(45) Date of Patent: Jan. 12, 2021

(54) ROBUST GMOS

(71) Applicant: Technion Research and Development Foundation LTD., Haifa (IL)

(72) Inventor: Yael Nemirovsky, Haifa (IL)

(73) Assignee: Technion Research and Development Foundation Ltd., Haifa (IL)

(*) Notice: Subject to any disclaimer, the term of this patent is extended or adjusted under 35 U.S.C. 154(b) by 190 days.

(21) Appl. No.: 16/106,598

(22) Filed: Aug. 21, 2018

(65) Prior Publication Data

US 2019/0064106 A1 Feb. 28, 2019

Related U.S. Application Data

(60) Provisional application No. 62/551,800, filed on Aug. 30, 2017.

(51) Int. Cl.
*G01N 27/414* (2006.01)
*G01J 5/04* (2006.01)
*H01L 27/144* (2006.01)
*G01J 5/02* (2006.01)
*G01J 5/06* (2006.01)
*G01J 5/00* (2006.01)
*G01N 27/16* (2006.01)

(52) U.S. Cl.
CPC ........ *G01N 27/4141* (2013.01); *G01J 5/0014* (2013.01); *G01J 5/022* (2013.01); *G01J 5/024* (2013.01); *G01J 5/045* (2013.01); *G01J 5/061* (2013.01); *G01N 27/16* (2013.01); *H01L 27/1446* (2013.01); *G01J 2005/063* (2013.01)

(58) Field of Classification Search
CPC ... G01N 27/4141; G01N 27/16; G01J 5/0014; G01J 5/022; G01J 5/024; G01J 5/045; G01J 5/061; G01J 2005/063; H01L 27/1446
See application file for complete search history.

(56) References Cited

U.S. PATENT DOCUMENTS

| | | | | |
|---|---|---|---|---|
| 5,345,213 A | * | 9/1994 | Semancik | B01L 7/54 257/253 |
| 6,060,025 A | * | 5/2000 | Pasquariello | G01N 27/16 204/406 |
| 6,436,346 B1 | * | 8/2002 | Doktycz | G01K 17/006 374/12 |
| 10,385,818 B2 | | 8/2019 | Kobayashi | |
| 2002/0146352 A1 | * | 10/2002 | Wang | G01N 27/16 422/96 |
| 2009/0035184 A1 | * | 2/2009 | Koda | G01N 27/16 422/94 |
| 2015/0372162 A1 | | 12/2015 | Technion et al. | |

(Continued)

*Primary Examiner* — Ryan D Walsh
(74) *Attorney, Agent, or Firm* — Reches Patent

(57) ABSTRACT

A gas sensing device, that may include a suspended gas sensing element, a frame that supports the suspended gas sensing element, and one or more traps for trapping at least one out of Siloxane and silicon dioxide. The suspended gas sensing element may include a gas reactive element that has a gas dependent temperature parameter, and a semiconductor temperature sensing element that is thermally coupled to the gas reactive element, and is configured to generate detection signals that are responsive to a temperature of the gas reactive element. The gas reactive element and the semiconductor temperature sensing element are of microscopic scale.

12 Claims, 13 Drawing Sheets

(56) References Cited

U.S. PATENT DOCUMENTS

| | | | |
|---|---|---|---|
| 2016/0206990 A1* | 7/2016 | Bossan | B01D 53/0454 |
| 2017/0205366 A1* | 7/2017 | Nemirovsky | G01K 7/01 |
| 2017/0211983 A1* | 7/2017 | Nemirovsky | G01J 5/0215 |
| 2018/0202884 A1* | 7/2018 | Nemirovsky | G01N 27/4077 |
| 2019/0011415 A1* | 1/2019 | Nemirovsky | G01N 33/0027 |
| 2019/0257804 A1* | 8/2019 | Brahem | G01N 27/12 |

* cited by examiner

ROBUST GMOS

CROSS REFERENCE

This application claims priority from U.S. provisional patent 62/551,800 Filing date Aug. 30, 2017.

BACKGROUND

Siloxanes are chemical compounds made of silicon and oxygen and are found in a variety of products ranging from personal care (e.g., hair shampoo) to lubricants and paints. Consequently, siloxanes can be found everywhere.

A siloxane is a functional group in organosilicon chemistry with the Si—O—Si linkage. The parent siloxanes include the oligomeric and polymeric hydrides with the formulae $H(OSiH_2)_nOH$ and $(OSiH_2)_n$. Siloxanes also include branched compounds, the defining feature of which is that each pair of silicon centers is separated by one oxygen atom. The siloxane functional group forms the backbone of silicones, the premier example of which is polydimethylsiloxane. The functional group $(RO)_3Si$ is called siloxy. (Wikipedia.org).

When siloxane-containing products are exposed to combustion, which is required in the combustion gas sensors, including the sensors illustrated in U.S. patent application 2015/0372162 and in U.S. patent application Ser. No. 15/748,623, the siloxanes are converted to silicon dioxide. The silicon dioxide is deposited within the combustion elements of the gas sensors, eventually causing reduced efficiency, performance degradation and eventually failure.

SUMMARY

There may be provided a gas sensing device, may include a suspended gas sensing element; a frame that supports the suspended gas sensing element; and one or more traps for trapping at least one out of Siloxane and silicon dioxide; wherein the suspended gas sensing element may include a gas reactive element that has a gas dependent temperature parameter; and a semiconductor temperature sensing element that may be thermally coupled to the gas reactive element, and may be configured to generate detection signals that are responsive to a temperature of the gas reactive element; and wherein the gas reactive element and the semiconductor temperature sensing element are of microscopic scale.

The one or more traps may include hexamethyldisilazane.

A trap of the one or more traps may be deposited on the frame.

A trap of the one or more traps may be positioned on a part of the suspended gas sensing element that differs from the gas reactive element.

The gas sensing element wherein a trap of the one or more traps may be positioned on a bulk that supports the frame, wherein the bulk may be spaced apart from the suspended gas sensing element.

The gas sensing element may include multiple gas sensing elements.

The gas sensing element wherein the one or more traps are positioned outside the gas sensing elements.

The gas sensing element wherein a trap of the one or more traps may be positioned outside the gas sensing elements and another trap of the one or more traps may be positioned on at least a part of one of the multiple gas sensing elements.

The gas sensing element wherein the multiple gas sensing elements may include a first gas sensing element for sensing a first gas with a first sensitivity level and a second gas sensing element for sensing a second gas with a second sensitivity level that may be coarser than the first sensitivity sensor, wherein a trap of the one or more traps may be positioned on at least a part of the second gas sensing element and not on the first gas sensing element.

The gas sensing element wherein the one or more traps may include multiple traps.

There may be provided a method for sensing gas by a gas sensing device, the method may include heating a gas reactive element of a suspended gas sensing element; wherein the gas reactive element has a gas dependent temperature parameter; wherein the suspended gas sensing element may be supported by a frame; measuring a temperature of the gas reactive element by a semiconductor temperature sensing element that may be thermally coupled to the gas reactive element; wherein the gas reactive element and the semiconductor temperature sensing element are of microscopic scale; generating, by the semiconductor temperature sensing element, detection signals that are responsive to a temperature of the gas reactive element; and trapping, by at least one trap of the gas sensing device at least one out of Siloxane and silicon dioxide.

The method may include sensing gas using any of the sensors mentioned in the application.

There may be provided method for manufacturing a gas sensing device, the method may include manufacturing, by applying a microelectromechanical system (MEMS) manufacturing process, the gas sensing device, wherein the gas sensing device may include a suspended gas sensing element, a frame that supports the suspended gas sensing element, and one or more traps for trapping at least one out of Siloxane and silicon dioxide; wherein the suspended gas sensing element may include a gas reactive element that has a gas dependent temperature parameter, and a semiconductor temperature sensing element that may be thermally coupled to the gas reactive element, and may be configured to generate detection signals that are responsive to a temperature of the gas reactive element; and wherein the gas reactive element and the semiconductor temperature sensing element are of microscopic scale.

The method may include manufacturing any of the sensors mentioned in the application.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

Figure 1:
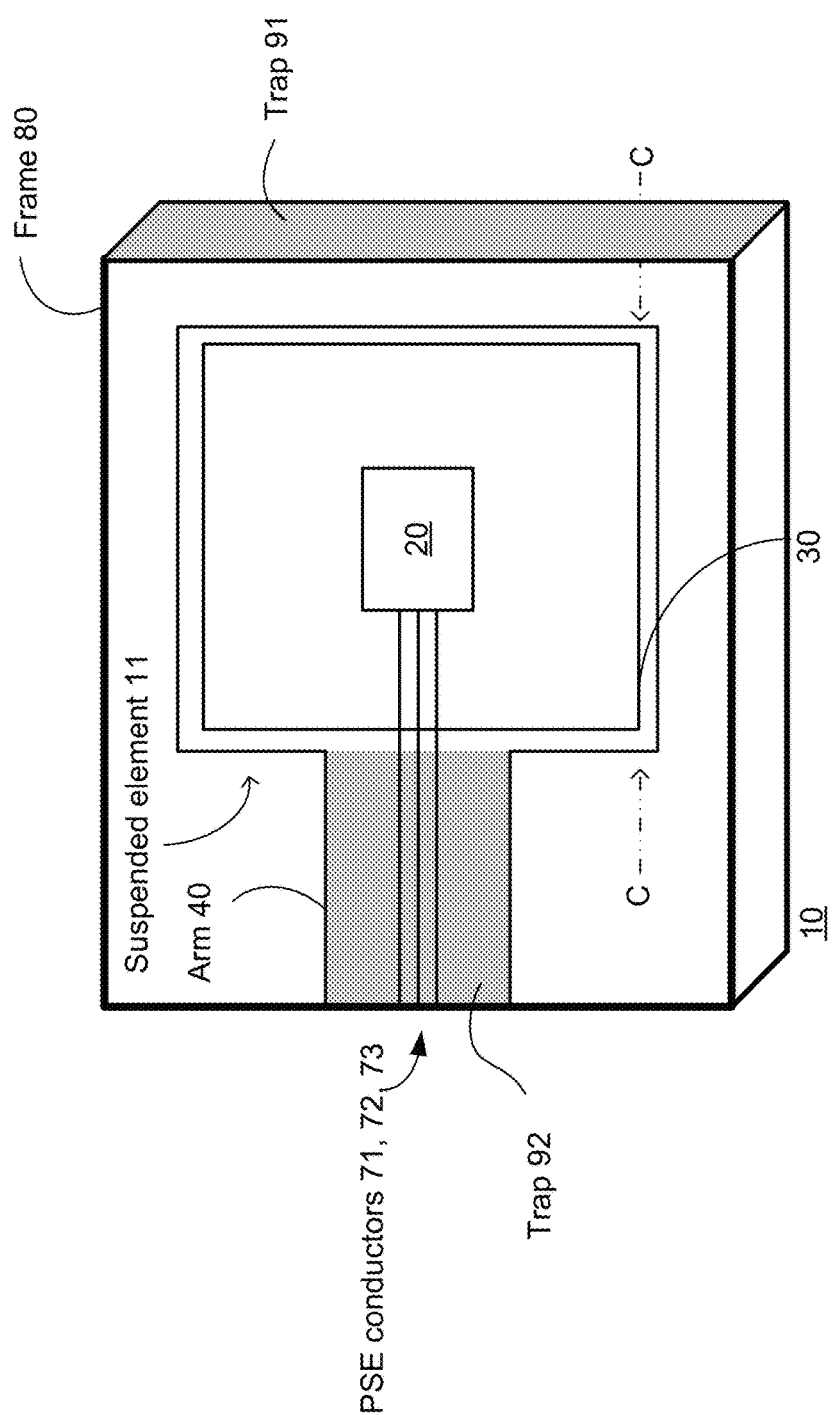
FIG. 1 is an example of a suspended gas sensing element, a frame, and two traps.

There is provided a device that includes a gas sensor that is durable and there may be provided gas sensor that is durable. The device or the gas sensor may include one or more traps and one or more gas sensing elements. The device may include one or more gas sensor and may or may not include additional circuits and/or components such as a readout circuit.

Any trap of the traps may be configured to capture the Siloxane (or silicon dioxide)—thereby limiting the deposition of the Siloxane (or silicon dioxide) on the combustion elements of the gas sensor—the gas reactive element of the gas sensor—that may include one or more catalytic layers.

The trap may be deposited (or otherwise positioned) on any location of the device (or the gas sensor)—preferably not on the gas reactive element of the device (or of the gas sensor).

The gas sensor may include multiple gas sensing elements. A trap may be positioned anywhere outside a gas reactive element—for example—on a supporting arm that supports a gas sensing element, on the top of a frame that supports one or more supporting arms, on one or more sidewalls of the frame, on a bottom or one or more sidewalls of a space (gap) formed between the gas sensing element and a bulk that supports the frame, near a gas sensing element but not on the gas sensing element, on a gas sensing element but not on the gas reactive element, and the like.

When the gas sensor includes multiple gas sensing elements—some of the gas sensing elements may be covered (fully or partially) by at least one trap.

When the device includes gas sensors that are tailored for sensing gases—the location of the traps may be responsive to the sensed gases—for example, the sensitivity level of each gas sensor or an importance of the detection of a specific gas. For example—a gas sensor aimed to detect a gas that has a lower priority and can be sensed with a coarser sensitivity—may be partially covered with a trap and/or may be more distance than a trap—and the like.

Traps may surround or partially surround the gas sensing elements—and may be positioned over other components of the device that includes the gas sensor—such as the readout circuit, any control circuit, and the like.

The trap may be made of a material that may have a strong bond with Siloxane (or silicon dioxide)—may be chemically similar to Siloxane (or silicon dioxide)—may be a chemically-like material that will promote physical and chemical absorption/adsorption of the silicon dioxide, produced by Siloxane.

The trap can be made of materials such as hexamethyl-disilazane (HDMS) or organosilicon compounds.

In microelectronics technology, HDMS in a liquid form is dispensed by spinning on the wafer below the photoresist to enhance adhesion of the photoresist to oxide layers residing on the silicon wafer.

The trap will trap Siloxane or the silicon dioxide—and reduce the probability that the Siloxane or the silicon oxide will be deposited on parts of the sensing elements (especially gas reactive elements or parts of gas reactive elements).

The Siloxane of the silicon dioxide may form a tighter bond with the trap than with the gas reactive element.

The trap may be formed in any shape and/or size. For example—the trap may include one or more layers of microscopic thickness (for example below 10 microns).

The gas sensor is manufactured using a MEMS manufacturing process that involves multiple deposition, etching and machining processes—and the trap may be generated during, before of following at least one of the etching, depositing and machining processes.

For example—the trap may be generated during the final stages (for example machining) of the MEMS process or in an earlier stage (prior to the micromachining steps (RIE and DRIE).

The trap may be deposited, and following the deposition process, there may be a thermal stabilization process—for example at about 110 Celsius for 1-2 minutes. Other temperatures and other durations may be provided.

FIG. 1 illustrates a gas sensor 10 that includes first trap 91, a second trap 92, a frame 80, and a gas sensing element 11 that is suspended—held by arm 40 that is connected to frame 80. The gas sensing element 11 is illustrated as including (i) a gas reactive element 30 that has a gas-dependent temperature parameter; (ii) a temperature sensing element 20 that is thermally coupled to the gas reactive element 30 and is configured to generate detection signals that are responsive to a temperature of the gas reactive element 30, and (iii) a heater.

The gas sensing element 11 may be coupled to conductors (such as PSE conductors 71, 72 and 73)—that may supply signals (bias signals, heating signals), may receive signals (used for measuring the temperature sensed by the temperature sensing element 20).

The conductors may act as a heater for heating the gas reactive element 30 to a predefined temperature that is suited (for that gas reactive element 30) for sensing a predefined gas.

There may be two, three or even more conductors.

Gas reactive element 30 that are tailored to sense different gases may be heated to different temperatures. Additionally or alternatively, heating a gas reactive element to different predefined temperatures will assist in detecting different gases.

The gas reactive element 30 can be made of a catalytic metal. A chemical reaction between the gas reactive element 30 and a certain gas may change the temperature of the gas reactive element 30. The temperature sensing element 20 is thermally coupled to the gas reactive element and thus is able to sense the temperature of the gas reactive element 30. It is noted that the heating device may be omitted from the gas sensing element.

First trap 91 is deposited on arm 40. Second trap 92 is deposited on a sidewall of frame 80. The frame is supported by a bulk (not shown). The gap between the gas sensing element 11 and the bulk is micromachined.

Figure 2:
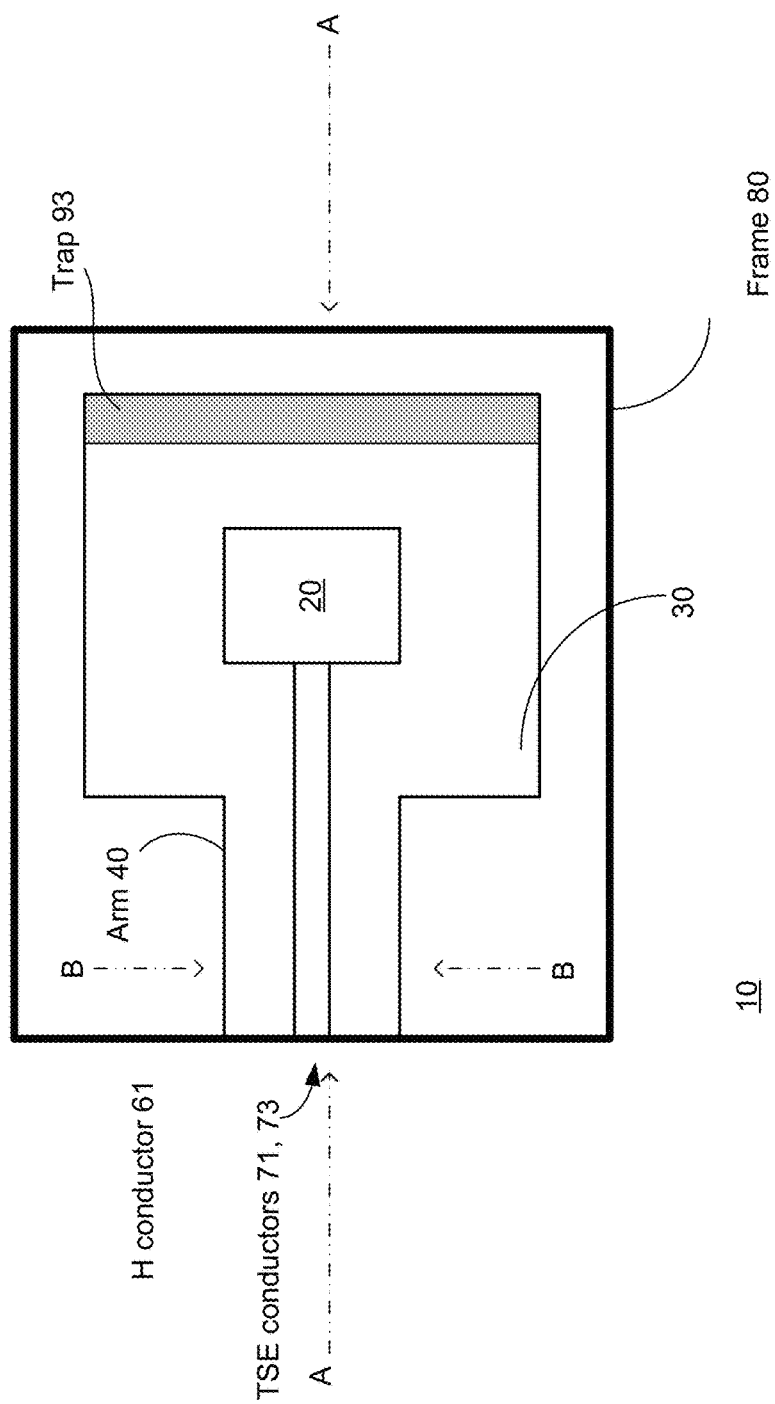
FIG. 2 is an example of a suspended gas sensing element, a frame, and two traps.

FIG. 2 illustrates a gas sensor 10 that includes conductors (such as TSE conductors 71 and 73), frame 80, arm 40 and gas reactive element 30. A third trap 93 of the gas sensor 10 is deposited on (only) a part of the gas reactive element.

Figure 3:
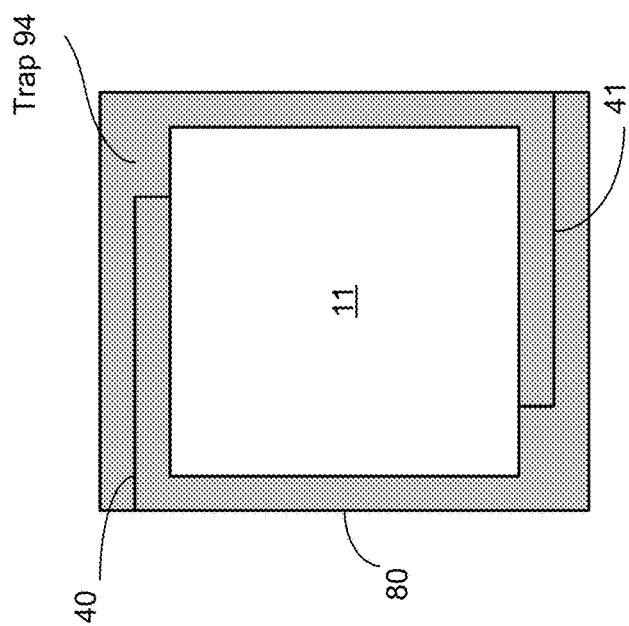
FIG. 3 is an example of a suspended gas sensing element, a frame, and a trap.

FIG. 3 illustrates a fourth trap 94 that is positioned on at least a part of the bulk—below the gas sensing element.

Figure 4:
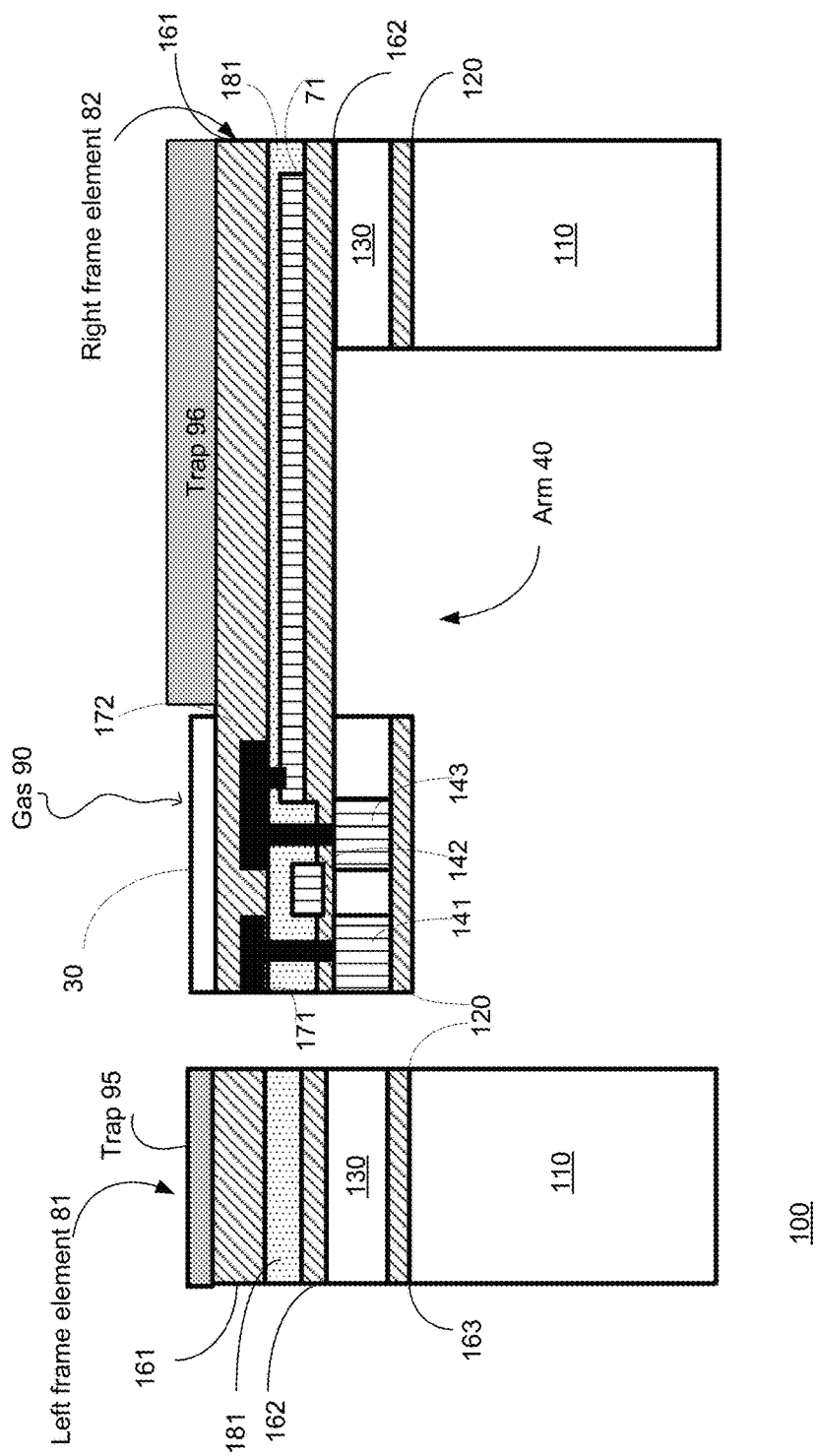
FIG. 4 is an example of a suspended gas sensing element, a frame, and two traps.

FIG. 4 illustrates a first trap 95 located on a top of the frame and a sixth trap 96 formed on top of arm 40.

FIG. 4 illustrates a gas sensor 100 that includes, a right frame 82, a left frame element 81, a thin silicon dioxide layer 163, and a first trap 95 that is located on a top of the frame and a sixth trap 96 formed on top of arm 40.

FIG. 4 also illustrates a semiconductor temperature sensing element such as a CMOS transistor that includes drain 141, source 143 and gate 142. Drain 141 is coupled to a drain conductor 171. Source 143 is coupled to a source conductor 172. Source conductor 172 and drain conductor 171 are made of metal and may be coupled to conductors 71 and 72 respectively. The gate 142 may be coupled to a gate conductor (now shown). Drain 141 and source 143 may be positioned above a thin silicon dioxide layer 120 that can be formed on top of thick silicon bulk 110. Bulk 110 and a thin device silicon layer 130 may be micro-machined or nano-machined to form a suspended gas sensing element. The thin silicon dioxide layer 120 of the buried oxide may serve as an etch stop layer for the bulk micromachining process and separates the bulk silicon from the thin device silicon layer 130. The thin device silicon layer may be a single crystal silicon layer. The stack of the thin device silicon layer 130 on top of thin silicon dioxide layer 120 on top of bulk 110 (for example a thick silicon bulk) is known as SOI and may be fabricated by several techniques, well known for the experts. An increase in the top silicon layer thickness, and increased control of its properties is preferably achieved using epitaxial growth of silicon. The bulk 110 serves as a heat sink to the thermal sensors due to the high thermal conductivity of the silicon and the large thickness of bulk 110. Bulk 110 is etched under the sensor area in order to provide thermal isolation for increased temperature responsivity.

Above the etched area a structure composed of layers such as but not limited to Complementary Metal Oxide Semiconductor (CMOS) thin film layers—such as first insulating layers 161 and second insulating layer 162—both known as Inter Level Dielectrics. The gas sensor also includes an intermediate layer 181 located between the first and second insulting layers 161 and 162.

Figure 5:
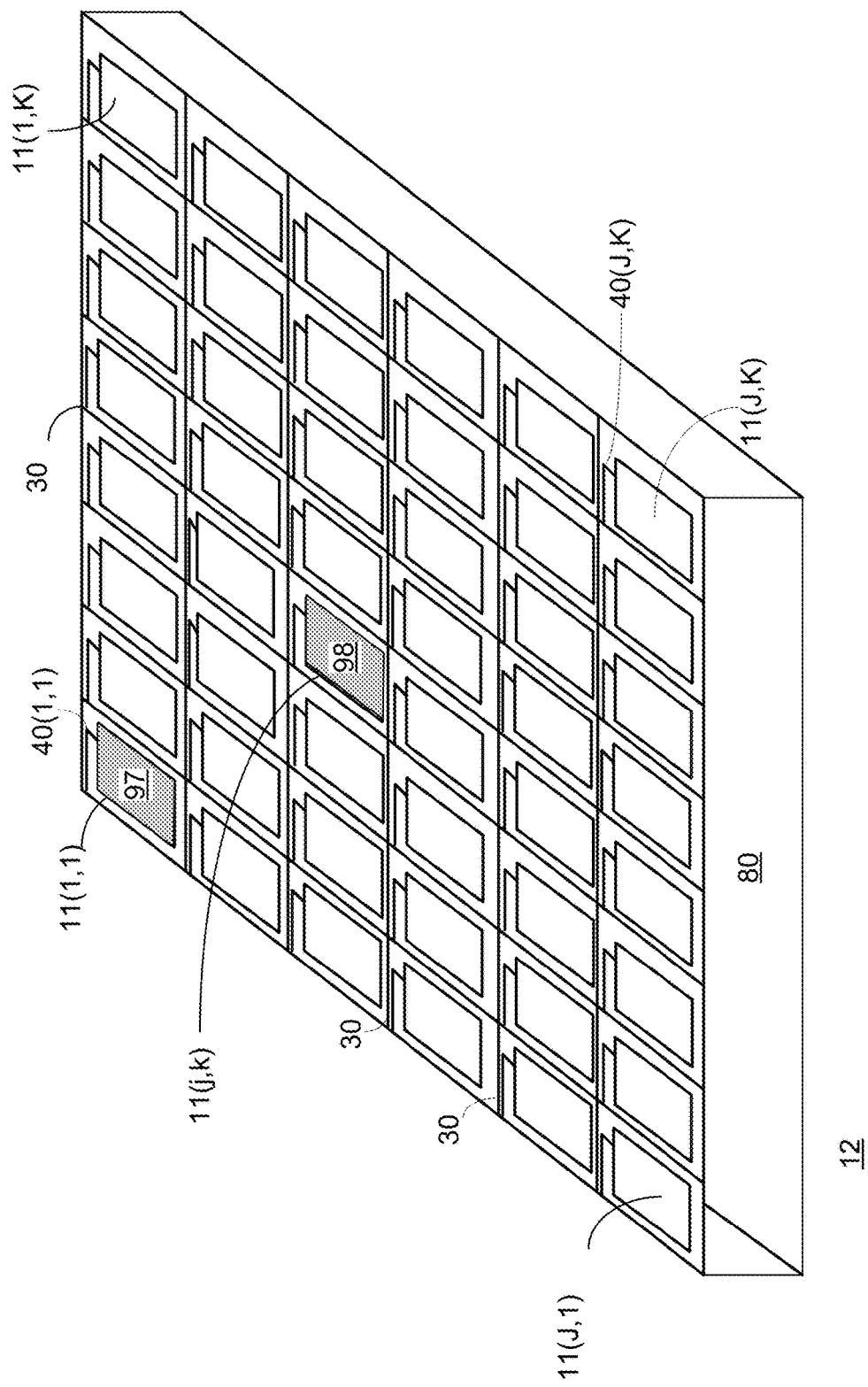
FIG. 5 is an example of an array of suspended gas sensing elements, a frame, and two traps.

FIG. 5 illustrates a seventh trap 97 and an eighth trap 98 and a rectangular array 12 of gas sensing elements 11(1, 1)—11(J,K) that include K columns and J rows of gas sensing elements. J and K are positive integers that exceed one.

Different gas sensing elements of the array may be configured to sense the same gas or different gases. A composition of the gas reactive element and, additionally or alternatively, a temperature to which the gas reactive element is heated may determine which gas is sensed by the gas reactive element.

The gas sensing elements of the array are supported by arms 40(1,1)—40(J,K) to a grid of frames collectively denoted 80. Each gas sensing element may be connected to one or more arms.

The gas sensing elements may be arranged to form other arrays. For example—a linear array, a non-rectangular array, a polygonal array, a circular array or any arrangements of multiple sensing elements.

Seventh trap 97 is deposited on gas sensing element 11(1,1) and eighth trap 98 is deposited on gas sensing element 11(j,k).

Figure 6:
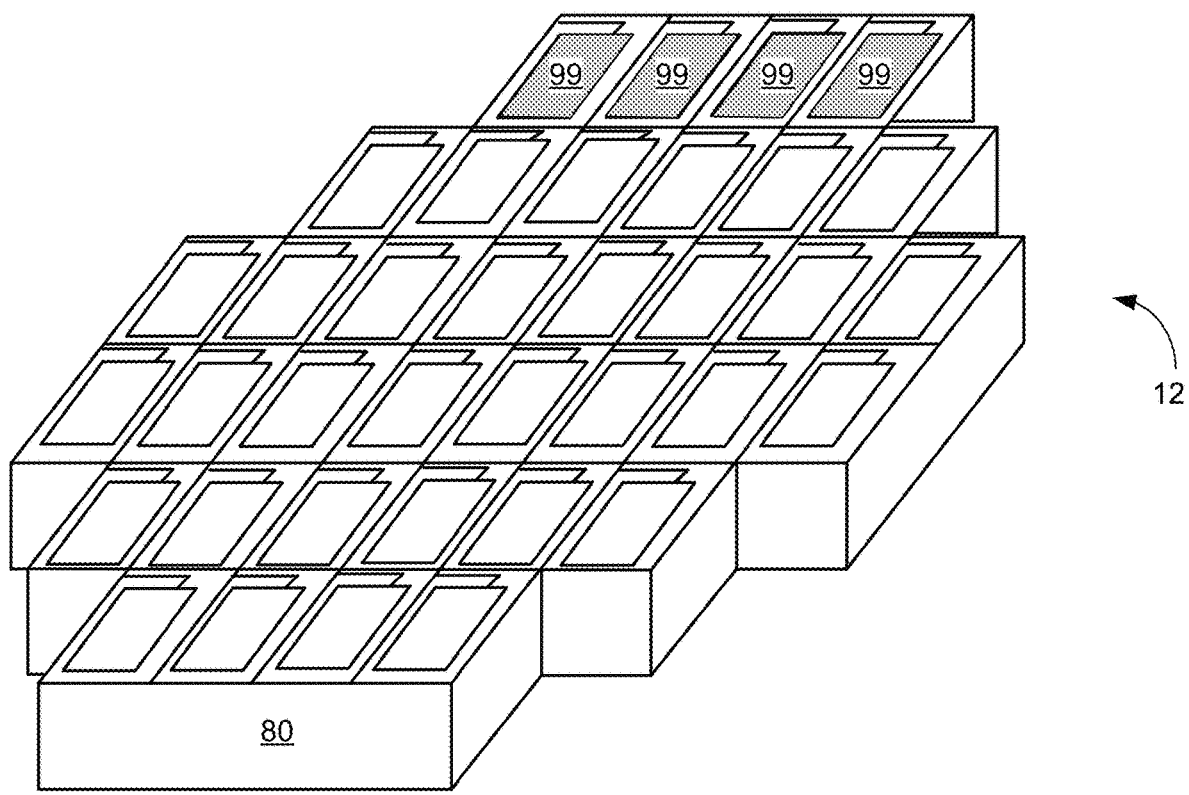
FIG. 6 is an example of an array of suspended gas sensing elements, a frame, and four traps.

FIG. 6 illustrates an array 12 of gas sensing elements and ninth traps 99 that are deposited on the first row of a non-rectangular grid of sensing elements.

Figure 7:
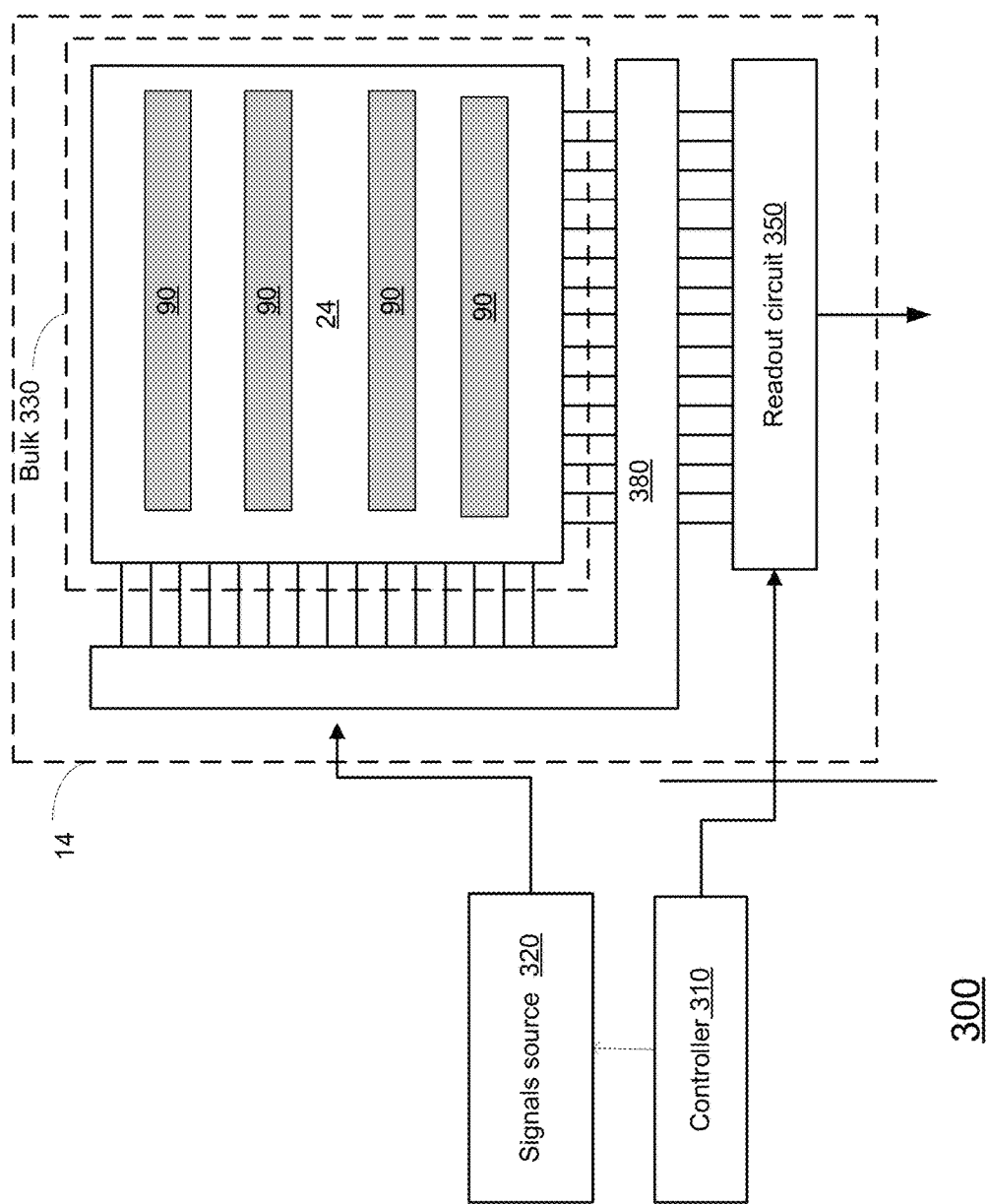
FIG. 7 is an example of a gas sensing device.

FIG. 7 illustrates a device such a gas sensing device 300 includes a controller 310, signals source 320, bulk 330, interfacing module 380, readout circuit 350 and an array 24 of gas sensing elements. The bulk 330, interfacing module 380, readout circuit 350 and the array 24 of gas sensing elements are collectively denoted 14. Four traps 90 are deposited on the array 24. Although interfacing module 380 is illustrated as a separate entity from the array 24, both array 24 and interfacing module 380 may be integrated. Interfacing module 380 may couple between the array 24 to the signals source 320 and to the readout circuit 350. Readout circuit 350 may read detection signals from one or more gas sensing elements at a time. For example—the readout circuit 350 may read a single row of array 24, a part of a row, more than a single row, a column, a part of a column, more than a column and even the entire array at once. Readout circuit 350 may read current detection signals, voltage detection signals, differential detection signals and the like.

The gas sensing device 300 may include reference sensing elements. The reference sensing elements may be included in array 24 or outside array 24. A reference sensing element has a semiconductor temperature sensing element but does not include a gas reactive element. Alternatively, the semiconductor temperature sensing element is not thermally coupled to the gas relative element or otherwise is not substantially affected by gas reactions.

The interfacing module 380 may also be electrically coupled between different gas sensing elements of the array 24. The interfacing module 380 may couple certain gas sensing elements of the array in serial to each other during one measurement and couple the certain gas sensing elements of the array in parallel to each other during another measurement. Any combination of serial and parallel couplings between gas sensing elements may be provided. The interfacing module 380 may include any combination of switches, interconnects and the like.

Signals source 320 is configured to supply bias signals to at least one gas sensing element of the array 24. The bias signals may include voltage bias signals and/or current bias signals. Some bias signals may set one or more semiconductor temperature sensing elements to one or more desired working points. Other bias signals may determine the heating applied by one or more heaters.

The bias signals may be provided in a continuous manner or in a non-continuous manner. The latter may reduce the power consumption of the gas sensing device. Conveniently, a first pulse aimed to bias a semiconductor temperature sensing elements of a certain gas sensing element is synchronized with a second pulse aimed to bias a heater of the certain gas sensing element. The second pulse may begin before the first pulse. The first and second pulse may be partially overlapping, fully overlapping or non-overlapping.

Controller 310 is configured to control the operation of the gas sensing device 300.

Controller 310, signals source 320, the bulk, interfacing module 380, readout circuit 350 and array 24 of gas sensing elements may be formed on the same chip. The gas sensing device 300 may be fabricated using CMOS technology.

Figure 8:
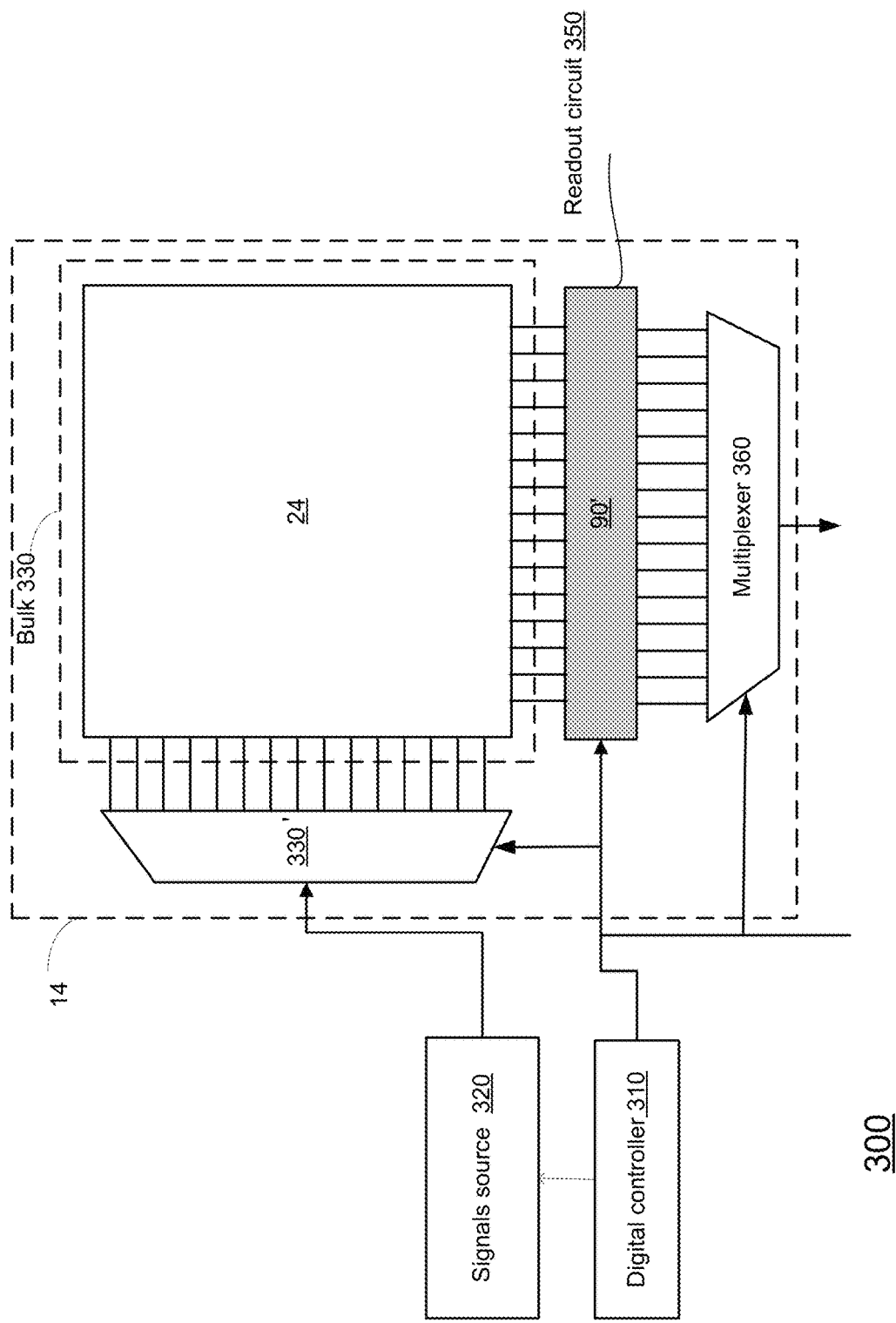
FIG. 8 is an example of a gas sensing device.

FIG. 8 illustrates a device such as a gas sensing device 300 according to an embodiment of the invention. A trap 90' is deposited on the readout circuit. In FIG. 8 the interfacing module 380 is illustrated as including (i) a de-multiplexer 330' that is coupled between signals source 320 and array 24, and (ii) a multiplexer 360 that is coupled between readout circuit 350 and an output port of gas sensing device. The trap 90', the de-multiplexer 330', the array 24, the multiplexer 360 and the readout circuit 350 are collectively denoted 14.

Regarding all of the previous figures—there may be any number of traps per gas sensing element, per gas sensor, per array of gas sensing elements, and per a device that includes one or more gas sensors. The traps may differ by number, position, shape and size from those illustrated in the figures.

For example—while FIG. 1 illustrates two traps—there may be only one of these traps, or there may be more than two traps. Yet for another example—in FIG. 2 the third trap covers about 10 percent of the gas reactive element 30—but the trap may cover more or less than 10 percent of the gas reactive element 30. There may be multiple traps per gas reactive element 30—and they may be shaped and sized in any manner.

Yet for a further example—referring to figures and 5—there may be only one trap on the array, there may be three or more traps of the array. A trap may cover a part of a gas sensing element or the entire gas sensing element. The traps may be positioned on any other gas sensing elements of the array.

Figure 9:
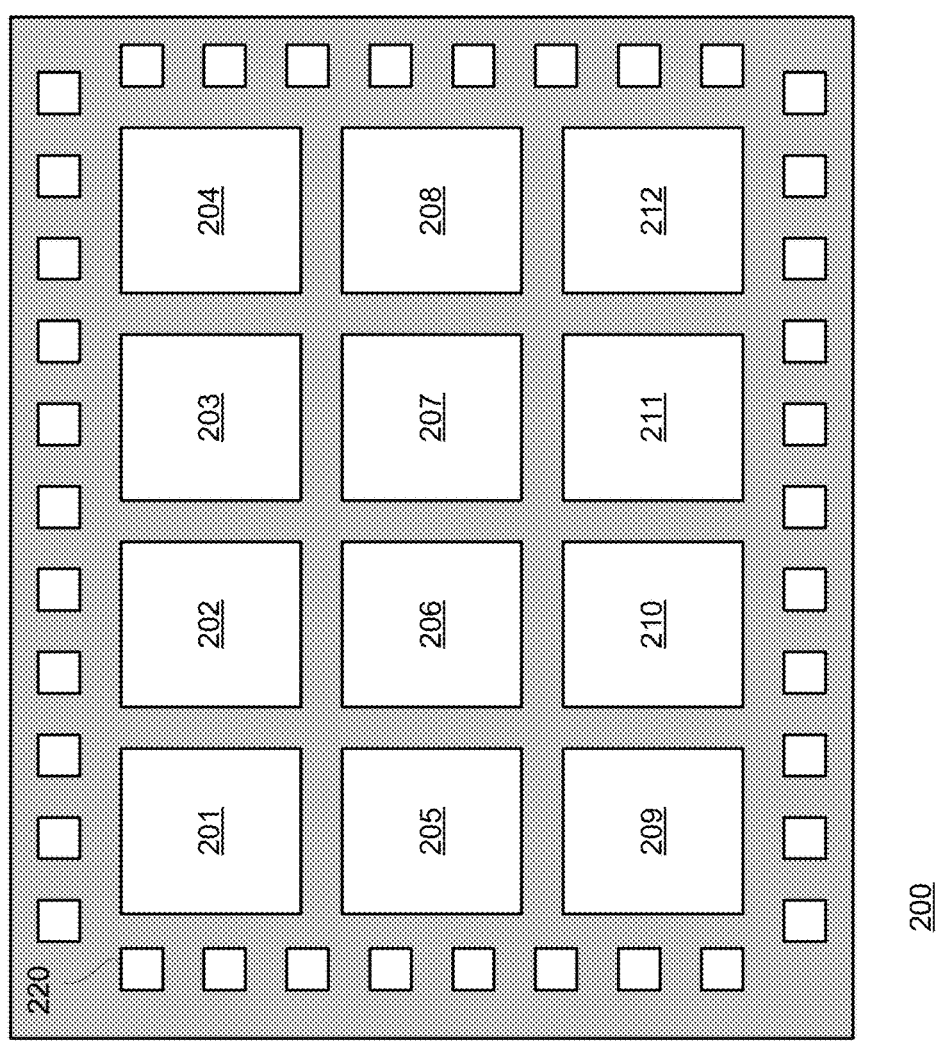
FIG. 9 is an example of an array of suspended gas sensing elements, a frame, and a trap.

FIG. 9 illustrates a device 200 that includes an array of gas sensors 201-212 that are surrounded by pads 22. The traps (grey) are located on all the device except the gas sensors 201-212.

Figure 10:
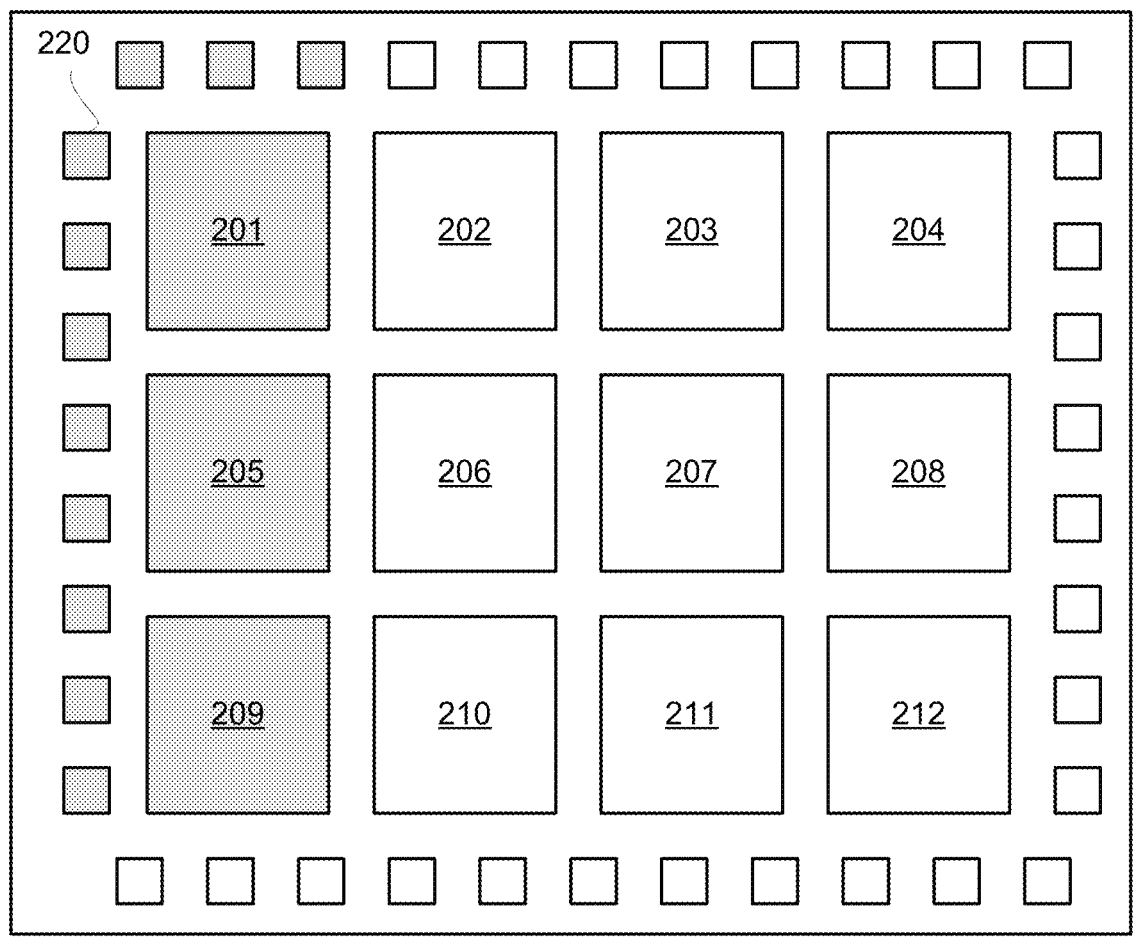
FIG. 10 is an example of an array of suspended gas sensing elements, a frame, and few traps.

FIG. 10 illustrates a device 200 that includes an array of gas sensors 201-212 that are surrounded by pads 22. The traps (grey) are located on some of the gas sensors 201-212.

Figure 11:
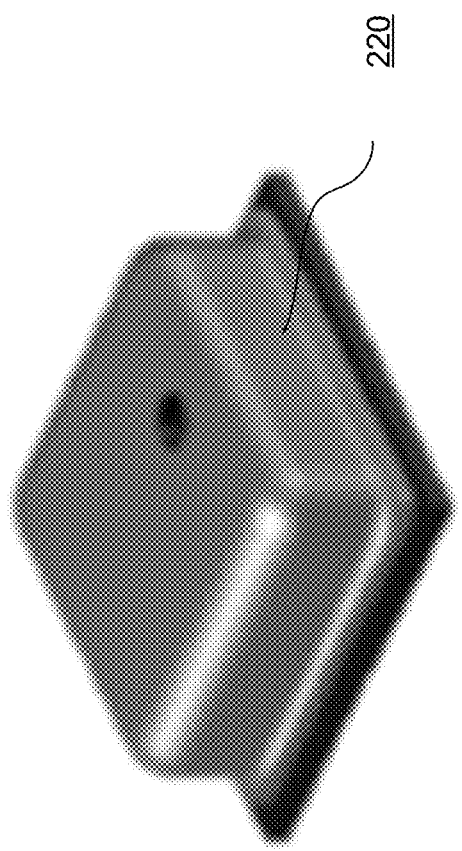
FIG. 11 is an example of a package of a gas sensing device.

FIG. 11 illustrates a package 220 of a gas sensing device that includes multiple gas sensors. The traps may be deposited on the package lid (inside part as well as outside part).

There may be provided a process for depositing or otherwise providing a "trapping surface area" that will remove the harmful silicon-dioxide from the catalytic reaction electrode, and a GMOS sensor that includes such a "trapping surface area".

There may be provided a process for depositing or otherwise providing material that would attract a deposition of Siloxane. Accordingly, Silanes adhesion chemicals may also be applied to remove the degrading effect of Siloxane upon the GMOS sensor.

Figure 12:
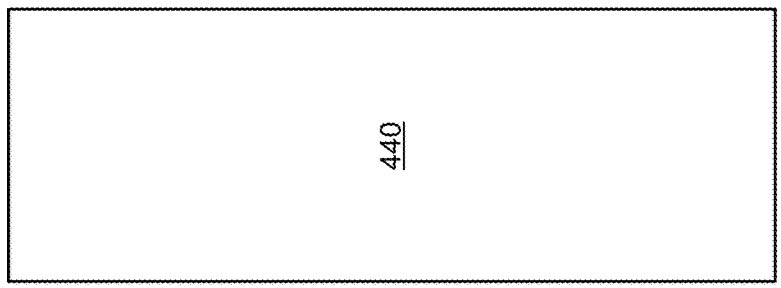
FIG. 12 is an example of a method.
Figure 12:
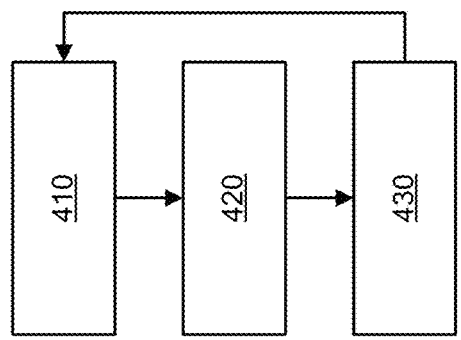

FIG. 12 illustrates method 400.

Method 400 may include steps 410, 420, 430 and 440.

Step 410 may include heating a gas reactive element of a suspended gas sensing element. The gas reactive element has a gas-dependent temperature parameter. The suspended gas sensing element is supported by a frame.

Step 420 may include measuring a temperature of the gas reactive element by a semiconductor temperature sensing element that is thermally coupled to the gas reactive element. The gas reactive element and the semiconductor temperature sensing element are of microscopic scale.

Step 430 may include generating, by the semiconductor temperature sensing element, detection signals that are responsive to a temperature of the gas reactive element.

Step 440 may include trapping, by at least one trap of the gas sensing device at least one out of Siloxane and silicon dioxide.

Steps 410, 420 and 430 are executed during a sensing period. Steps 410, 420 and 430 may be repeated multiple times—during different sensing periods. The sensing periods may be spaced apart from each other.

Step 440 may be applied constantly, may be applied during a sensing period and between sensing periods.

Any of the mentioned above gas sensing devices may be operated during method 400.

Figure 13:
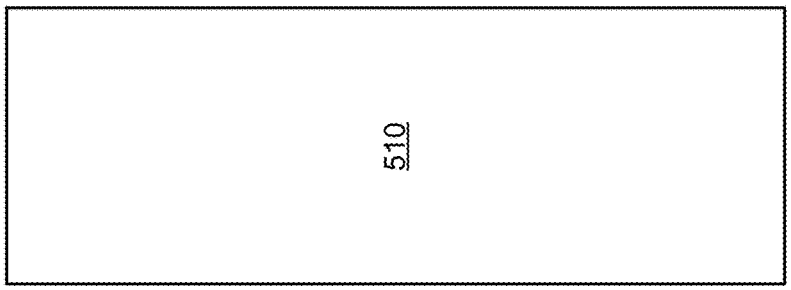
FIG. 13 is an example of a method.

FIG. 13 illustrates method 500.

Method 500 may include step 510.

Method 500 is a method for manufacturing a gas sensing device.

Method 500 may include manufacturing, by applying a microelectromechanical system (MEMS) manufacturing process, the gas sensing device, wherein the gas sensing device may include a suspended gas sensing element, a frame that supports the suspended gas sensing element, and one or more traps for trapping at least one out of Siloxane and silicon dioxide. The suspended gas sensing element may include a gas reactive element that has a gas-dependent temperature parameter, and a semiconductor temperature sensing element that is thermally coupled to the gas reactive element, and is configured to generate detection signals that are responsive to a temperature of the gas reactive element; and wherein the gas reactive element and the semiconductor temperature sensing element are of microscopic scale.

The manufacturing of the one or more traps may follow the manufacturing or other parts if the gas sensing device, may start after some parts are formed, and the like. The manufacturing of the one or more traps may follow any machining process, or may start before one or more machining processes.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may, for example, be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

I claim:

1. A gas sensing device, comprising:
   a suspended gas sensing element;
   a frame that supports the suspended gas sensing element; and
   one or more traps for trapping at least one out of Siloxane and silicon dioxide;
   wherein the suspended gas sensing element comprises:
      a gas reactive element that has a gas dependent temperature parameter; and
      a semiconductor temperature sensing element that is thermally coupled to the gas reactive element, and is configured to generate detection signals that are responsive to a temperature of the gas reactive element; and
      wherein the gas reactive element and the semiconductor temperature sensing element are of microscopic scale.

2. The gas sensing device according to claim 1 wherein the one or more traps comprises hexamethyldisilazane.

3. The gas sensing device according to claim 1 wherein a trap of the one or more traps is deposited on the frame.

4. The gas sensing device according to claim 1 wherein a trap of the one or more traps is positioned on a part of the suspended gas sensing element that differs from the gas reactive element.

5. The gas sensing element according to claim 1 wherein a trap of the one or more traps is positioned on a bulk that supports the frame, wherein the bulk is spaced apart from the suspended gas sensing element.

6. The gas sensing element according to claim 1 comprising multiple gas sensing elements.

7. The gas sensing element according to claim 6 wherein the one or more traps are positioned outside the gas sensing elements.

8. The gas sensing element according to claim 6 wherein a trap of the one or more traps is positioned outside the gas sensing elements and another trap of the one or more traps is positioned on at least a part of one of the multiple gas sensing elements.

9. The gas sensing element according to claim 6 wherein the multiple gas sensing elements comprises a first gas sensing element for sensing a first gas with a first sensitivity level and a second gas sensing element for sensing a second gas with a second sensitivity level that is coarser than the first sensitivity sensor, wherein a trap of the one or more traps is positioned on at least a part of the second gas sensing element and not on the first gas sensing element.

10. The gas sensing element according to claim 6 wherein the one or more traps comprises multiple traps.

11. A method for sensing gas by a gas sensing device, the method comprises:
   heating a gas reactive element of a suspended gas sensing element; wherein the gas reactive element has a gas dependent temperature parameter; wherein the suspended gas sensing element is supported by a frame;
   measuring a temperature of the gas reactive element by a semiconductor temperature sensing element that is thermally coupled to the gas reactive element; wherein the gas reactive element and the semiconductor temperature sensing element are of microscopic scale;
   generating, by the semiconductor temperature sensing element, detection signals that are responsive to a temperature of the gas reactive element; and
   trapping, by at least one trap of the gas sensing device at least one out of Siloxane and silicon dioxide.

12. A method for manufacturing a gas sensing device, the method comprises manufacturing, by applying a microelectromechanical system (MEMS) manufacturing process, the gas sensing device, wherein the gas sensing device comprises a suspended gas sensing element, a frame that supports the suspended gas sensing element, and one or more traps for trapping at least one out of Siloxane and silicon dioxide; wherein the suspended gas sensing element comprises a gas reactive element that has a gas dependent temperature parameter, and a semiconductor temperature sensing element that is thermally coupled to the gas reactive element, and is configured to generate detection signals that are responsive to a temperature of the gas reactive element; and wherein the gas reactive element and the semiconductor temperature sensing element are of microscopic scale.

* * * * *